United States Patent
Nakamura

(10) Patent No.: US 9,511,707 B2
(45) Date of Patent: Dec. 6, 2016

(54) VEHICULAR LAMP

(71) Applicant: KOITO MANUFACTURING CO., LTD., Tokyo (JP)

(72) Inventor: Hiromi Nakamura, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 14/679,631

(22) Filed: Apr. 6, 2015

(65) Prior Publication Data

US 2015/0283936 A1    Oct. 8, 2015

(30) Foreign Application Priority Data

Apr. 7, 2014   (JP) .................. 2014-078630

(51) Int. Cl.
*B60Q 1/00* (2006.01)
*H05K 1/18* (2006.01)
*F21S 8/10* (2006.01)

(52) U.S. Cl.
CPC ........... *B60Q 1/0088* (2013.01); *B60Q 1/0058* (2013.01); *F21S 48/212* (2013.01); *F21S 48/215* (2013.01); *F21S 48/218* (2013.01); *H05K 1/189* (2013.01); *F21S 48/1154* (2013.01); *F21S 48/1225* (2013.01); *F21S 48/1258* (2013.01)

(58) Field of Classification Search
CPC .. F21S 48/1212; F21S 48/215; F21S 48/518; F21S 48/1154; F21S 48/1225; F21S 48/1258; B60Q 1/0088; B60Q 1/0058; H05K 1/189

USPC ......................................... 362/543, 544, 545
See application file for complete search history.

(56) References Cited

U.S. PATENT DOCUMENTS

| | | | | |
|---|---|---|---|---|
| 8,820,990 B2* | 9/2014 | Wegner | .................. | B29C 45/16 362/511 |
| 2003/0147253 A1* | 8/2003 | Shy | ...................... | B60Q 1/2665 362/545 |
| 2004/0246737 A1* | 12/2004 | Voelker | .................. | B60Q 1/444 362/503 |
| 2007/0008736 A1* | 1/2007 | Gasquet | ............... | B60Q 1/2607 362/511 |

FOREIGN PATENT DOCUMENTS

| | | | |
|---|---|---|---|
| DE | 102006009317 | * | 9/2007 |
| JP | 2010-015910 A | | 1/2010 |

OTHER PUBLICATIONS

Computer generated translation for DE102006009317; WWW.google.dj/patents/DE102006009317; accessed Apr. 25, 2016.*

* cited by examiner

*Primary Examiner* — Laura Tso
(74) *Attorney, Agent, or Firm* — Osha Liang LLP

(57) ABSTRACT

A lamp that is mounted on a vehicle has a transparent substrate including a conductive layer, a light-emitting element supported by the transparent substrate and electrically connected to the conductive layer, a connection portion electrically connected to the conductive layer at an end of the transparent substrate, and a connector electrically connected to the connection portion.

10 Claims, 2 Drawing Sheets

VEHICULAR LAMP

BACKGROUND

Technical Field

The present invention relates to lamps that are mounted on vehicles.

Related Art

Lamps in which a flexible circuit board having light-emitting elements as light sources mounted thereon is disposed in a lamp chamber are known as this type of lamp (see, e.g., Patent Document 1). Since flexible substrates are deformable due to their flexibility, the use of flexible substrates can increase the freedom of design choice with respect to arrangement of the light-emitting elements in the lamp chamber.

RELATED ART DOCUMENTS

Patent Document 1: Japanese Patent Application Laid-Open (Kokai) No. 2010-15910

SUMMARY

Light emitted from light-emitting elements are radiated in a predetermined direction through a translucent cover that defines a lamp chamber. Since the light-emitting elements are mounted on a flexible circuit board, the flexible circuit board can be seen through the translucent cover when the light-emitting elements are unlit, which adversely affects the appearance. In view of the above, a cover that covers up the flexible circuit board is required. This may increase component cost and assembly time.

One or more embodiments of the present invention may avoid an increase in component cost and assembly time without adversely affecting the appearance even when light-emitting elements are unlit.

According to one or more embodiments of the present invention, a lamp that is mounted on a vehicle includes: a transparent substrate including a conductive layer; a light-emitting element supported by the transparent substrate and electrically connected to the conductive layer; a connection portion electrically connected to the conductive layer at an end of the transparent substrate; and a connector electrically connected to the connection portion.

The light-emitting element is supported by the transparent substrate including the conductive layer. Accordingly, even when the light-emitting element is unlit, it is difficult to see the substrate supporting the light-emitting element from the outside of a lamp chamber. This eliminates the need for a cover that covers up the substrate. An increase in component cost and assembly time can thus be avoided without adversely affecting the appearance of the lamp even when the light-emitting element is unlit.

The connection portion may be more flexible than the transparent substrate.

With this configuration, the connector can be easily placed at a position where it cannot be easily seen from the outside of the lamp chamber. This can reduce the dimensions of a cover that covers up the connector. Moreover, bending the connection portion in an appropriate direction can reduce the dimensions of the lamp chamber in a longitudinal direction of the transparent substrate. In other words, the transparent substrate can be placed by making the most of a portion that can be seen from the outside of the lamp chamber. Accordingly, an increase in component cost and assembly time can be avoided without adversely affecting the appearance of the lamp even when the light-emitting element is unlit.

The connection portion may be opaque.

Bending the connection portion in an appropriate direction by using its flexibility higher than that of the transparent substrate makes it easier to place the opaque portion at a position where it cannot be easily seen from the outside of the lamp chamber. This can reduce the dimensions of a cover that covers up the opaque portion. An increase in component cost and assembly time can therefore be avoided without adversely affecting the appearance of the lamp even when the light-emitting element is unlit.

The connection portion may be a flexible circuit board. In this case, the connector is disposed on a first surface of the flexible circuit board. A reinforcing member that is less flexible than the transparent substrate is provided on a second surface of the flexible circuit board at a position facing the connector.

According to this configuration, in addition to the above effects, the connection portion can be provided with flexibility high enough to achieve the freedom of design choice with respect to the position of the connector and strength high enough to support the connector. The use of the reinforcing member makes it easier to fix the connector at an appropriate location in the lamp chamber.

The lamp may further include a light source different from the light-emitting element. In this case, the light-emitting element emits light to a first side of the transparent substrate, and at least part of light emitted from the light source passes through the transparent substrate and is radiated to the first side.

According to this configuration, in addition to the above effects, the light that is emitted from the light-emitting element and the light that is emitted from the light source are radiated in an overlapping manner, whereby an unconventional light emission pattern can be formed. When the light-emitting element and the light source are unlit, the light-emitting element appears to be floating in front of the light source, which can provide an unconventional, sophisticated appearance.

DETAILED DESCRIPTION

Embodiments of the present invention will be described in detail below with reference to the accompanying drawings. In each figure used in the following description, the scale of each member has been changed as appropriate in order to allow each member to have a recognizable size. The terms "right" and "left" as used in the following description refer to the right and left as viewed from the driver's seat. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 1:
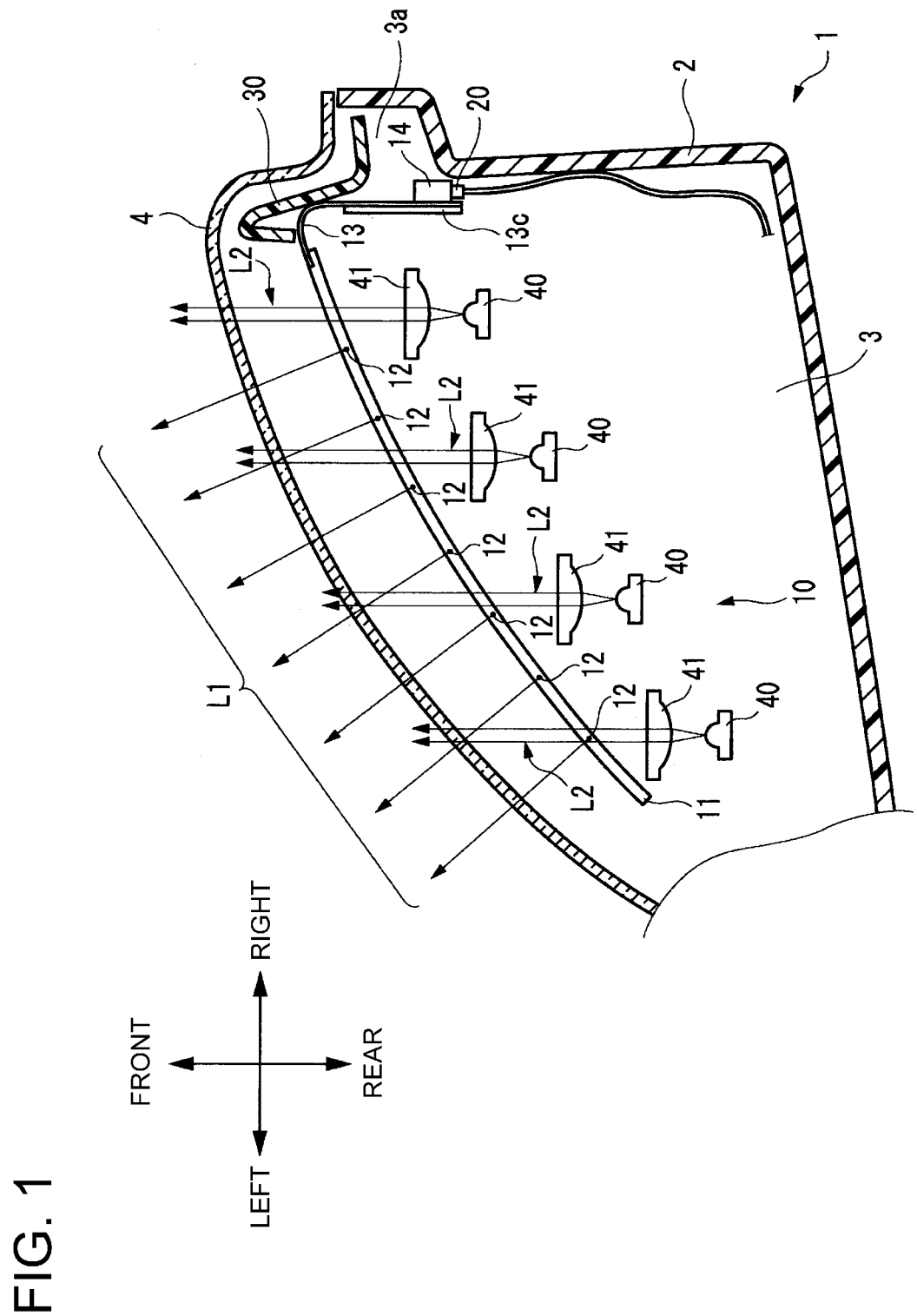
FIG. 1 is a plan view showing partially in cross section a lighting device including a lamp unit according to one or more embodiments of the present invention.

FIG. 1 is a diagram showing a part of a left headlamp device 1 according to one or more embodiments of the present invention, taken along a horizontal plane and viewed from above. The left headlamp device 1 is a device that is mounted on the left side of the front part of a vehicle to illuminate the road ahead of the vehicle. The left headlamp 1 includes a housing 2, and a translucent cover 4 that is attached to the housing 2 to define and form a lamp chamber 3. A lamp unit 10 (an example of the lamp) according to one or more embodiments of the present invention is disposed in the lamp chamber 3.

Figure 2A:
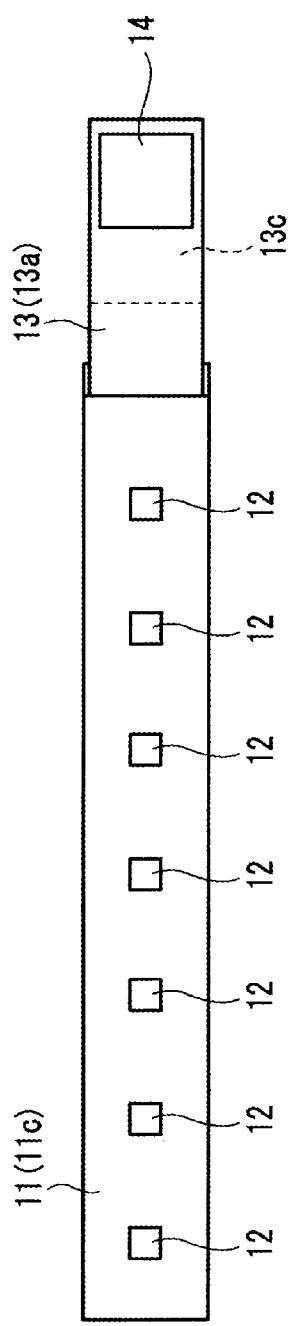
FIGS. 2(A)-2(C) show diagrams showing the configuration of the lamp unit in FIG. 1.
Figure 2B:
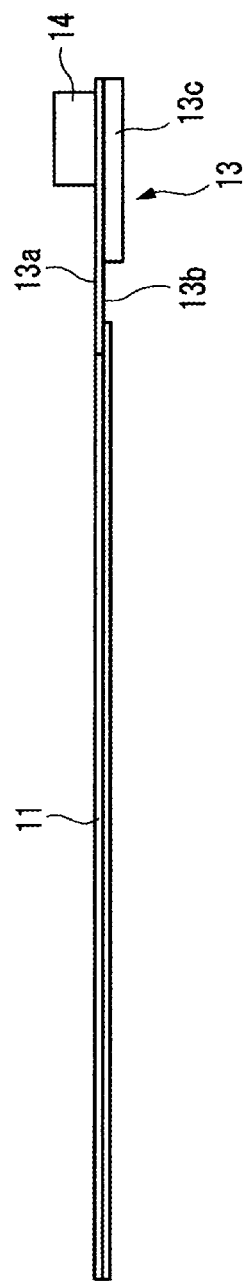

FIG. 2(a) is a front view showing the appearance of the lamp unit 10. FIG. 2(b) is a side view showing the appearance of the lamp unit 10. The lamp unit 10 includes a transparent substrate 11, a plurality of light-emitting elements 12, a connection portion 13, and a connector 14. For example, each of the light-emitting elements 12 is a light-emitting diode that emits light of a predetermined color.

Figure 2C:
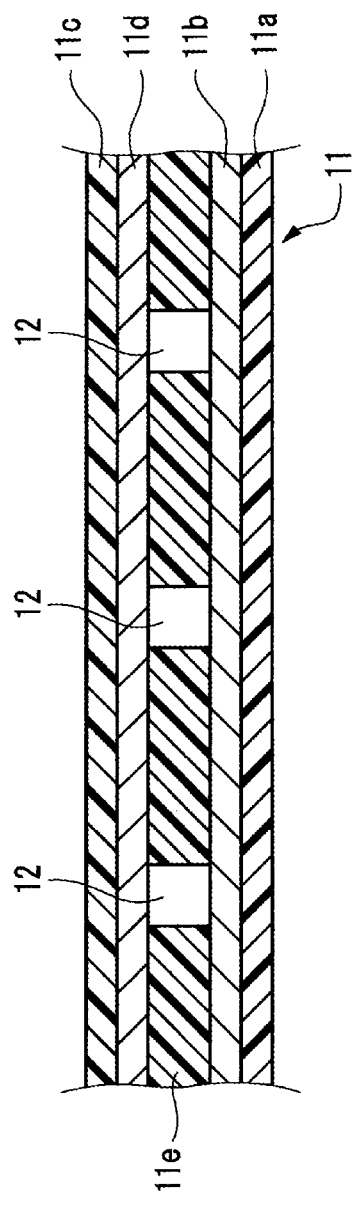

FIG. 2(c) is a partial enlarged cross-sectional view of the transparent substrate 11. The transparent substrate 11 includes a first base film 11a, a first conductive layer 11b, a second base film 11c, a second conductive layer 11d, and an adhesive layer 11e. Each of the first base film 11a, the first conductive layer 11b, the second base film 11c, the second conductive layer 11d, and the adhesive layer 11e is translucent. The first base film 11a and the second base film 11c are made of, e.g., polyethylene terephthalate (PET). The first conductive layer 11b and the second conductive layer 11d are made of, e.g., indium tin oxide (ITO).

The first conductive layer 11b is placed on the first base film 11a. The second conductive layer 11d is placed on the second base film 11c. Each light-emitting element 12 is disposed so as to be interposed between the first conductive layer 11b and the second conductive layer 11d, and is electrically connected to the first conductive layer 11b and the second conductive layer 11d. The adhesive layer 11e bonds the first conductive layer 11b and the second conductive layer 11d, and fixes each light-emitting element 12 at a predetermined position.

Light emitted from each light-emitting element 12 passes through the second conductive layer 11d and the second base film 11c and is emitted to the upper side in FIG. 2(b) (an example of the first side). When viewed from the front as shown in FIG. 2(a), each light-emitting element 12 supported by the transparent substrate 11 appears to be flowing in the air through the second base film 11c and the second conductive layer 11d.

The connection portion 13 is electrically connected to the first conductive layer 11b and the second conductive layer 11d at an end in the longitudinal direction of the transparent substrate 11. That is, the connection portion 13 includes a conductive path (not shown) that is electrically connected to the first conductive layer 11b and the second conductive layer 11d.

The connector 14 is electrically connected to the connection portion 13. That is, the connector 14 includes a terminal (not shown) that is electrically connected to the conductive path of the connection portion.

As shown in FIG. 1, a connector 20 that supplies electric power from a power supply, not shown, is disposed in the lamp chamber 3. The connector 20 is connected to the connector 14. The electric power is supplied to the transparent substrate 11 via the connector 14 and the connection portion 13. For example, the first conductive layer 11b is used as a power supply-side conductive path, and the second conductive layer 11d is used as a ground-side conductive path. Each light-emitting element 12 emits light by the supplied electric power. The lamp unit 10 is disposed in the lamp chamber 3 so that light emitted from each light-emitting element 12 travels toward the translucent cover 4. That is, the lamp unit 10 is disposed such that the second base film 11c of the transparent substrate 11 faces the outside of the lamp chamber 3.

As described above, each light-emitting element 12 is supported by the transparent substrate 11 including the conductive layers. Accordingly, even when the light-emitting elements 12 are unlit, it is difficult to see the substrate supporting each light-emitting element 12 from the outside of the lamp chamber 3. This eliminates the need for a cover that covers up the substrate. An increase in component cost and assembly time can thus be avoided without adversely affecting the appearance of the lamp unit 10 even when the light-emitting elements 12 are unlit.

As shown in FIG. 1, the transparent substrate 11 is flexible, and can be disposed in a curved state in the lamp chamber 3. The connection portion 13 is more flexible than the transparent substrate 11. The connection portion 13 is bent at a side end 3a of the lamp chamber 3 so as to extend rearward. The connector 14 is thus located rearward of the transparent substrate 11 and is connected to the connector 20. A cover 30 that covers up the connectors 14, 20 are disposed in front of the connectors 14, 20.

Since the connection portion 13 is more flexible than the transparent substrate 11, the connectors 14, 20 can be easily placed at positions where the connectors 14, 20 cannot be easily seen from the outside of the lamp chamber 3. This can reduce the dimensions of the cover that covers up the connectors 14, 20. Moreover, bending the connection portion 13 in an appropriate direction can reduce the dimensions of the lamp chamber 3 in the longitudinal direction of the transparent substrate 11. In other words, the transparent substrate 11 can be placed by making the most of a portion that can be seen from the outside of the lamp chamber 3. Accordingly, an increase in component cost and assembly time can be avoided without adversely affecting the appearance of the lamp unit 10 even when the light-emitting elements 12 are unlit.

In one or more embodiments of the present invention, the connection portion 13 is a flexible circuit board. However, the connection portion 13 may be formed by a wire harness as long as it has a conductive path that can provide each light-emitting element 12 supported by the transparent substrate 11 with the electric power supplied through the connector 14.

These members are generally opaque. However, bending the connection portion 13 in an appropriate direction by using its flexibility higher than that of the transparent substrate 11 makes it easier to place the opaque portion at a position where it cannot be easily seen from the outside of the lamp chamber 3. This can reduce the dimensions of the cover that covers up the opaque portion. An increase in component cost and assembly time can therefore be avoided without adversely affecting the appearance of the lamp unit 10 even when the light-emitting elements 12 are unlit.

As shown in FIG. 2(b), the connector 14 is placed on an upper surface 13a (an example of the first surface) of the connection portion 13 (flexible circuit board). A reinforcing member 13c is provided on a lower surface 13b (an example of the second surface) of the connection portion 13 at a position facing the connector 14. The reinforcing member 13c is less flexible than the transparent substrate 11.

According to this configuration, in addition to the above effects, the connection portion 13 can be provided with flexibility high enough to achieve the freedom of design choice with respect to the position of the connector 14 and strength high enough to support the connector 14. The use of the reinforcing member 13*c* makes it easier to fix the connection portion between the connectors 14, 20 at an appropriate location in the lamp chamber 3.

As shown in FIG. 1, the lamp unit 10 further includes a plurality of light sources 40 different from the light-emitting elements 12. Each light source 40 may be a semiconductor light-emitting element such as a light-emitting diode, a laser diode, or an organic EL element, or a lamp light source such as an incandescent lamp, a halogen lamp, a discharge lamp, or a neon lamp.

The lamp unit 10 further includes a plurality of lenses 41. Each lens 41 is disposed between a corresponding one of the plurality of light sources 40 and the transparent substrate 11. At least part of light emitted from each light source 40 passes through its corresponding lens 41 and the transparent substrate 11 and is radiated to the front (an example of the first side) of the transparent substrate 11.

The radiation direction of the light that is emitted from each light source 40 can be determined as appropriate. In the example shown in FIG. 1, the radiation directions of light L1 that is emitted from each light-emitting element 12 and light L2 that is emitted from each light source 40 are different from each other. However, arrangement etc. of the light sources 40 and the lenses 41 may be changed as appropriate so that the radiation direction of the light L1 becomes the same as that of the light L2. In addition to or instead of the lenses 41, an optical part such as a reflector may be provided to adjust the radiation direction of the light L2.

According to this configuration, in addition to the above effects, the light L1 and the light L2 are radiated in an overlapping manner, whereby an unconventional light emission pattern can be formed. When the light-emitting elements 12 and the light sources 40 are unlit, the light-emitting elements 12 appear to be floating in front of the light sources 40, which can provide an unconventional, sophisticated appearance.

The above embodiments are shown in order to facilitate understanding of the present invention, and are not intended to limit the present invention. It should be understood that embodiments of the present invention can be modified or improved without departing from the spirit and scope of the invention, and that the present invention includes equivalents thereof.

In one or more of the above embodiments, the transparent substrate 11 includes the first conductive layer 11*b* and the second conductive layer 11*d*. However, the transparent substrate 11 may have at least one conductive layer as long as a power supply path that drives each light-emitting element 12 can be formed.

In one or more of the above embodiments, the seven light-emitting elements 12 are supported by the transparent substrate 11. However, any number of light-emitting elements 12 may be used as long as a desired lighting function can be fulfilled.

In other words, a lighting device on which the lamp unit 10 according to one or more embodiments of the present invention is mounted is not limited to the left headlamp device 1. It should be understood that the lamp unit 10 may be mounted on a right headlamp device, and one or more embodiments of the present invention may be applicable to lamps that are mounted on vehicular lighting devices such as various marker lamps.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF THE REFERENCE NUMERALS

10 LAMP UNIT
11 TRANSPARENT SUBSTRATE
11*b* FIRST CONDUCTIVE LAYER
11*d* SECOND CONDUCTIVE LAYER
12 LIGHT-EMITTING ELEMENT
13 CONNECTION PORTION (FLEXIBLE CIRCUIT BOARD)
13*a* UPPER SURFACE OF FLEXIBLE CIRCUIT BOARD
13*b* LOWER SURFACE OF FLEXIBLE CIRCUIT BOARD
13*c* REINFORCING MEMBER
14 CONNECTOR
40 LIGHT SOURCE

The invention claimed is:

1. A lamp that is mounted on a vehicle, comprising:
a transparent substrate including a translucent conductive layer;
a light-emitting element supported by the transparent substrate and electrically connected to the conductive layer;
a connection portion electrically connected to the conductive layer at an end of the transparent substrate; and
a connector electrically connected to the connection portion.

2. The lamp according to claim 1,
wherein the connection portion is more flexible than the transparent substrate.

3. The lamp according to claim 2,
wherein the connection portion is opaque.

4. A lamp that is mounted on a vehicle, comprising:
a transparent substrate including a conductive layer;
a light-emitting element supported by the transparent substrate and electrically connected to the conductive layer;
a connection portion electrically connected to the conductive layer at an end of the transparent substrate; and
a connector electrically connected to the connection portion,
wherein the connection portion is more flexible than the transparent substrate,
wherein the connection portion is a flexible circuit board,
wherein the connector is disposed on a first surface of the flexible circuit board, and
wherein a reinforcing member that is less flexible than the transparent substrate is provided on a second surface of the flexible circuit board at a position facing the connector.

5. The lamp according to claim 1, further comprising:
a light source different from the light-emitting element,
wherein the light-emitting element emits light to a first side of the transparent substrate, and
wherein at least part of light emitted from the light source passes through the transparent substrate and is radiated to the first side.

6. A lamp that is mounted on a vehicle, comprising:
a transparent substrate including a conductive layer;
a light-emitting element supported by the transparent substrate and electrically connected to the conductive layer;

a connection portion electrically connected to the conductive layer at an end of the transparent substrate; and
a connector electrically connected to the connection portion,
wherein the connection portion is more flexible than the transparent substrate,
wherein the connection portion is opaque,
wherein the connection portion is a flexible circuit board,
wherein the connector is disposed on a first surface of the flexible circuit board, and
wherein a reinforcing member that is less flexible than the transparent substrate is provided on a second surface of the flexible circuit board at a position facing the connector.

7. The lamp according to claim 2, further comprising:
a light source different from the light-emitting element,
wherein the light-emitting element emits light to a first side of the transparent substrate, and
wherein at least part of light emitted from the light source passes through the transparent substrate and is radiated to the first side.

8. The lamp according to claim 3, further comprising:
a light source different from the light-emitting element,
wherein the light-emitting element emits light to a first side of the transparent substrate, and
wherein at least part of light emitted from the light source passes through the transparent substrate and is radiated to the first side.

9. The lamp according to claim 4, further comprising:
a light source different from the light-emitting element,
wherein the light-emitting element emits light to a first side of the transparent substrate, and
wherein at least part of light emitted from the light source passes through the transparent substrate and is radiated to the first side.

10. The lamp according to claim 6, further comprising:
a light source different from the light-emitting element,
wherein the light-emitting element emits light to a first side of the transparent substrate, and
wherein at least part of light emitted from the light source passes through the transparent substrate and is radiated to the first side.

* * * * *